United States Patent
Koch et al.

(10) Patent No.: US 11,402,752 B2
(45) Date of Patent: Aug. 2, 2022

(54) FABRICATION OF OPTICAL INTERCONNECT STRUCTURES FOR A PHOTONIC INTEGRATED CIRCUIT

(71) Applicant: Arizona Board of Regents on Behalf of the University of Arizona, Tucson, AZ (US)

(72) Inventors: Thomas L. Koch, Tucson, AZ (US); Robert A. Norwood, Tucson, AZ (US); Stanley K. H. Pau, Tucson, AZ (US); Nasser N. Peyghambarian, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 15/764,064

(22) PCT Filed: Oct. 3, 2016

(86) PCT No.: PCT/US2016/055199
§ 371 (c)(1),
(2) Date: Mar. 28, 2018

(87) PCT Pub. No.: WO2017/059445
PCT Pub. Date: Apr. 6, 2017

(65) Prior Publication Data
US 2018/0314151 A1   Nov. 1, 2018

Related U.S. Application Data

(60) Provisional application No. 62/236,445, filed on Oct. 2, 2015.

(51) Int. Cl.
*G03F 7/00*   (2006.01)
*B29D 11/00*  (2006.01)
(Continued)

(52) U.S. Cl.
CPC ........... *G03F 7/0005* (2013.01); *B29D 11/00* (2013.01); *B29D 11/0075* (2013.01);
(Continued)

(58) Field of Classification Search
None
See application file for complete search history.

(56) References Cited

U.S. PATENT DOCUMENTS

| 5,854,868 A | 12/1998 | Yoshimura et al. |
| 6,097,871 A | 8/2000  | De Dobbelaere |

(Continued)

OTHER PUBLICATIONS

"Application of two-photon 3D lithography for the fabrication of embedded ORMOCER waveguides," by Schmidt et al, Proceedings of SPIE, vol. 6476, 64760, 2007.
(Continued)

*Primary Examiner* — Chris H Chu
(74) *Attorney, Agent, or Firm* — Stuart H. Mayer; Mayer & Williams PC

(57) ABSTRACT

A method of fabricating an optical connection to at least one planar optical waveguide integrated on a planar integrated circuit (PIC) uses a machine vision system or the like to detect one or more positions at which one or more optical connections are to be made to at least one planar optical waveguide located on the PIC. A spatial light modulator (SLM) is used as a programmable photolithographic mask through which the optical connections are written in a volume of photosensitive material using a photolithographic process. The SLM is programmed to expose the photosensitive material to an illumination pattern that defines the optical connections. The programming is based at least in part on the positions that have been detected by the vision system. The optical connections are printed by exposing the photosensitive material to illumination that is modulated by the pattern with which the SLM is programmed.

13 Claims, 6 Drawing Sheets

(51) Int. Cl.

| | | |
|---|---|---|
| *G02B 6/12* | (2006.01) | |
| *G03F 7/20* | (2006.01) | |
| *G02B 6/122* | (2006.01) | |
| *G02B 6/124* | (2006.01) | |
| *G03F 7/027* | (2006.01) | |
| *G03F 7/075* | (2006.01) | |
| *G03F 7/038* | (2006.01) | |

(52) U.S. Cl.
CPC ......... *G02B 6/12004* (2013.01); *G02B 6/124* (2013.01); *G02B 6/1228* (2013.01); *G03F 7/0037* (2013.01); *G03F 7/2057* (2013.01); *G03F 7/027* (2013.01); *G03F 7/038* (2013.01); *G03F 7/0757* (2013.01)

(56) References Cited

U.S. PATENT DOCUMENTS

| | | |
|---|---|---|
| 6,245,584 B1 | 6/2001 | Marinaro |
| 6,544,698 B1 | 4/2003 | Fries |
| 7,184,617 B2 | 2/2007 | Korenaga |
| 7,794,561 B2 | 9/2010 | Lamprecht |
| 8,351,752 B2 * | 1/2013 | Shibata ................ G02B 6/1221 385/132 |
| 8,442,368 B1 | 5/2013 | Reano |
| 2004/0046271 A1 | 3/2004 | Watts |
| 2004/0071387 A1* | 4/2004 | Mule ................. G02B 6/12002 385/14 |
| 2004/0184704 A1 | 9/2004 | Bakir |
| 2006/0068334 A1* | 3/2006 | Sandstrom .......... G03F 7/70291 430/322 |
| 2006/0245754 A1 | 11/2006 | Valette et al. |
| 2008/0246106 A1 | 10/2008 | Beausoleil et al. |
| 2010/0081068 A1 | 4/2010 | Kim |
| 2010/0272314 A1 | 10/2010 | Cournoyer et al. |
| 2011/0097034 A1 | 4/2011 | Uemura |
| 2011/0116741 A1 | 5/2011 | Cevini |
| 2012/0020612 A1 | 1/2012 | Ito |
| 2012/0224804 A1 | 9/2012 | Hashimoto |
| 2012/0307215 A1* | 12/2012 | Sano ..................... B81B 7/0061 355/30 |
| 2013/0003166 A1* | 1/2013 | Williamson ........ G03F 7/70291 359/318 |
| 2013/0223788 A1 | 8/2013 | Koos |
| 2014/0300877 A1* | 10/2014 | Menon .................. H01L 21/027 355/53 |
| 2014/0334768 A1 | 11/2014 | Chang |
| 2016/0131842 A1 | 5/2016 | Mahgerefteh |
| 2016/0238786 A1 | 8/2016 | Garner |
| 2017/0343733 A1 | 11/2017 | Sutherland |

OTHER PUBLICATIONS

"UV-written channel waveguides in ion-exchanged Pyrex," by Sheridan et al, Proceedings of European Conference on Integrated Optics, Apr. 2003.

"Direct-UV-written buried channel waveguide lasers in direct-bonded intersubstrate ion-exchanged neodymium-doped germano-borosilicate glass" by Gawith et al, Appl. Phys. Lett., vol. 81, 3522-3524, 2002.

* cited by examiner

FABRICATION OF OPTICAL INTERCONNECT STRUCTURES FOR A PHOTONIC INTEGRATED CIRCUIT

CROSS REFERENCE TO RELATED APPLICATION

This application claims the benefit of U.S. Provisional Application Ser. No. 62/236,445, filed Oct. 2, 2015, the entire contents of which are incorporated herein by reference.

BACKGROUND

An important problem in optical packaging involves the optical interconnection of planar-integrated photonic integrated circuits (chip-chip connections) and the connection of such circuits to optical fibers (fiber-chip connection). Photonic Integrated Circuits (PICs) refer to waveguide-based photonic components, including optical integrated devices such as lasers, optical amplifiers, switches, filters, modulators, splitters and the like; PICs can also include integration with semiconductor devices such as CMOS devices. PICs allow systems with high complexity and multiple functions to be integrated on a single substrate to thereby allow the generation, detection, propagation and modulation of both optical and electrical signals. PICs may employ a variety of different material systems, including silicon, silicon dioxide, polymer, lithium niobate, InP and GaAs, and optical interconnection processes should be compatible with these material systems. Existing wire bonding techniques that have been successfully applied to electrical connections in electronic integrated circuits cannot be easily extended to optical connection in a photonic integrated circuit.

The components of a PIC are generally manufactured by different processes and the dimensions of the components have different specifications and variations. For example, the variation in the dimensions of a CMOS detector is determined by extreme ultraviolet EUV lithography and is generally much less than a micron. On the other hand, the variation in the dimensions of a lithium niobate modulator fabricated by contact UV lithography can be on the order of a micron. The different components are arranged by a pick-and-place machine, for example, on a substrate to form a final device. The dimensions and locations of the components can fluctuate from one device to another. In order to form a single mode optical connection between the components, the optical connection must be positioned to within a fraction of a wavelength, $\lambda_o/n$, where $\lambda_o$ is the operating wavelength of the optical connection and n is the refractive index. The fabrication of many optical connections requires an active, robust and expensive technique that takes into account the tolerances and variation of the PIC configurations.

SUMMARY

In accordance with one aspect of the present disclosure, an inexpensive, high-throughput, relaxed tolerance method is presented for fabricating interconnects on a Photonic Integrated Circuit (PIC). In one particular, implementation, a machine vision system or the like is used to detect one or more positions at which one or more optical connections are to be made to at least one planar optical waveguide located on the PIC. A spatial light modulator (SLM) is configured for use as a programmable photolithographic mask through which the one or more optical connections are able to be written in a volume of photosensitive material using a photolithographic process. The SLM is configured by programming the SLM to expose the volume of photosensitive material to an illumination pattern that defines the one or more optical connections. The programming is based at least in part on the positions that have been detected by the vision system. The one or more optical connections are printed in the volume of photosensitive material by exposing the volume of photosensitive material to illumination that is modulated by the pattern with which the SLM is programmed.

The use of the vision system to determine the positions at which the optical connections are to be made on the PIC advantageously avoids the need for use of a high precision positioning stage to carefully align the PIC with the photolithographic or other write system. Moreover, lateral misalignments between the components on the PIC that are being interconnected can be easily accommodated since the vision system can determine and adjust the illumination pattern as needed for any particular arrangement and placement of components This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 3 shows a cross-sectional view of the PIC shown in FIGS. 2a and 2b taken along line A-A in FIG. 2a.

DETAILED DESCRIPTION

Figure 1:
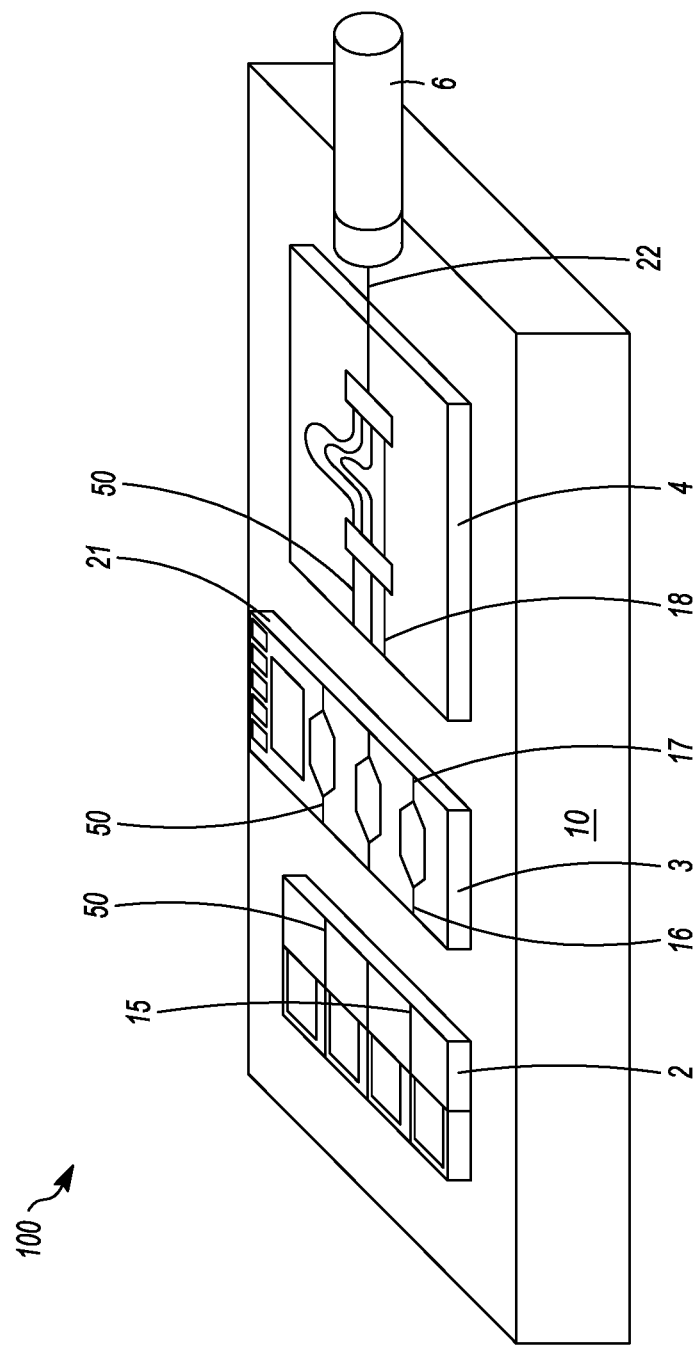
FIG. 1 shows a perspective view of one example of a Photonic Integrated Circuit (PIC) to which the techniques described herein may be applied.

FIG. 1 shows a perspective view of one example of a Photonic Integrated Circuit (PIC) to which the techniques described herein may be applied. PIC 100 includes multiple photonic systems that are integrated on different substrates ("chips") 2, 3 and 4 and which contain lateral single-mode waveguides 50. The waveguides 50 positioned on different chips are to be interconnected and/or are to be connected to input/output waveguide 6. The various components 2, 3 and 4 are mounted on a substrate 10 that serves as a component carrier. The components of the PIC 100 are to be interconnected with optical interconnect structures at connecting points 15, 16, 17 and 18. For instance, one optical interconnect structure may interconnect points 15 and 16 and another optical interconnect structure may interconnect points 17 and 18.

Fabrication of the optical interconnect structures will be described with reference to FIGS. 2a and 2b, which show a simplified plan view and side-view, respectively of a PIC 200 that includes two chips 210 and 220 that are located on a substrate 230. The chips 210 and 220 include respective waveguides 212 and 222 that are to be interconnected with one another. The waveguides 212 and 222 are generally (but not necessarily) silicon on insulator (SOI) waveguide and may be formed, for example, on respective oxide layers 215 and 217 that overlie chips 210 and 220, respectively. The waveguides 212 and 222 include inverse tapers in which the waveguide cross-section is decreased to a size that is typically smaller than a maximum waveguide cross-section such that the waveguide remains single mode, in order to also expand the mode profile. In some embodiments the inverse tapers are adiabatically tapered to allow optical energy to be adiabatically coupled with minimal loss. The waveguides 212 and 222 are shown as being misaligned and offset from one another. This misalignment may result from less than optimal placement of the chips 210 and 220 on the substrate 230.

In one embodiment, the interconnect structure is formed by a photolithographic process. The process begins by applying a photosensitive polymer 240 over at least the portions of the PIC 200 where the optical waveguide interconnect structures are to be formed. In the example shown in FIG. 2 the polymer is applied as a tape. In other implementations the polymer may be applied over the structure as a fluid. In one embodiment a maskless lithographic process may be used to induce polymerization reactions in the polymer through photochemical processes. In this way the refractive index of the exposed portions of the polymer material is increased (or decreased) and an optical waveguide interconnect structure is thus generated which is embedded in the polymer material. This can also occur through a multi-photon process, whereby the wavelength of the exposure is a multiple of the wavelength of the normal UV radiation process. Whether the refractive index of the exposed portions of the polymer material is increased or decreased depends on the nature of the polymer that is used. In some cases the exposed portions will increase the refractive index, in which case the polymerization process will create the waveguide core. In other cases the exposed portions will decrease the refractive index, in which case the polymerization process will create the cladding adjacent to the core.

It should be noted that while the example described herein employs a selective photopolymerization process, other types of reactions may be used to create refractive index changes in polymers, such as by photodegradation and photoisomerization, for instance.

By way of illustration, Table 1 shows several classes of commercially available photopolymers that may be employed. In addition to the classes shown, other varieties are available with lower refractive indices and insertion losses. It should be noted, however, that ultra-low propagation loss is generally not needed for chip-to-chip interconnection applications.

TABLE 1

| Polymer | R.I. range | Loss @ 1550 nm (dB/cm) | Supplier and comments |
|---|---|---|---|
| ZPU12-RI | 1.45-1.47 | 0.35 dB/cm | ChemOptics Photodefinable Wet and dry etchable VOAs in Korean Telecom |
| ZPU13-RI | 1.43-1.45 | 0.35 dB/cm | ChemOptics Photodefinable Wet and dry etchable |

TABLE 1-continued

| Polymer | R.I. range | Loss @ 1550 nm (dB/cm) | Supplier and comments |
|---|---|---|---|
| OE 4140 and OE 4141 | 1.51-1.53 | 0.7 dB/cm | VOAs in Korean Telecoms Dow Corning Photodefinable Similar mils used by IBM |

Referring again to FIGS. 2a and 2b, the resulting optical waveguide interconnect 260 formed in the polymer 240 can be operated as a waveguide(s) with the ambient air functioning as cladding material. However, the interconnect structures may also be embedded in low-refractive cladding 250 and in this way can be stabilized mechanically and protected against physical and chemical environmental influences. In addition to allowing optical coupling between waveguides in the vertical direction, the use of adiabatic tapered waveguides as shown in this example advantageously enables optical coupling between laterally offset waveguide as well. In this way asymmetries that arise from misalignment can be accommodated during the process of fabricating the interconnect structure.

Figure 2A:
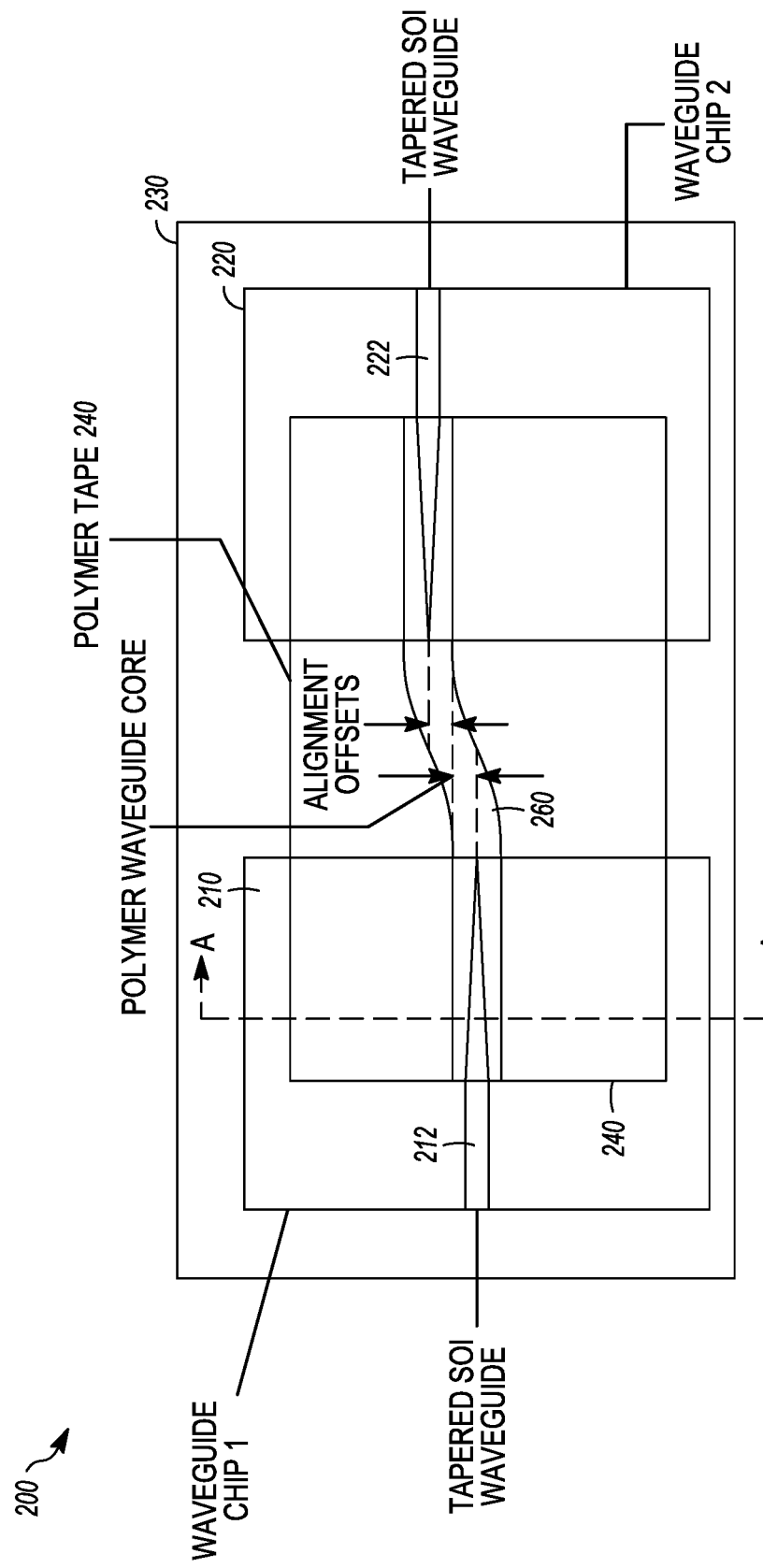
FIGS. 2a and 2b show a simplified plan view and side-view, respectively of a PIC that includes two chips.
Figure 2B:
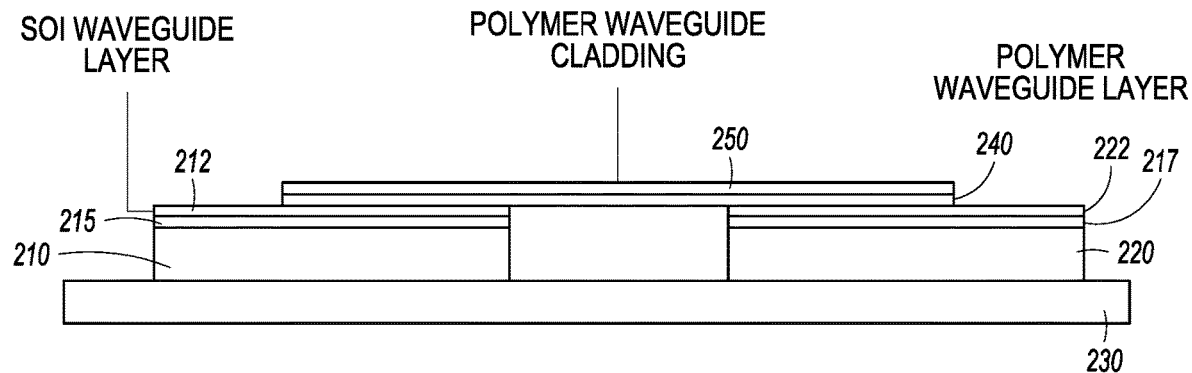
Figure 3:
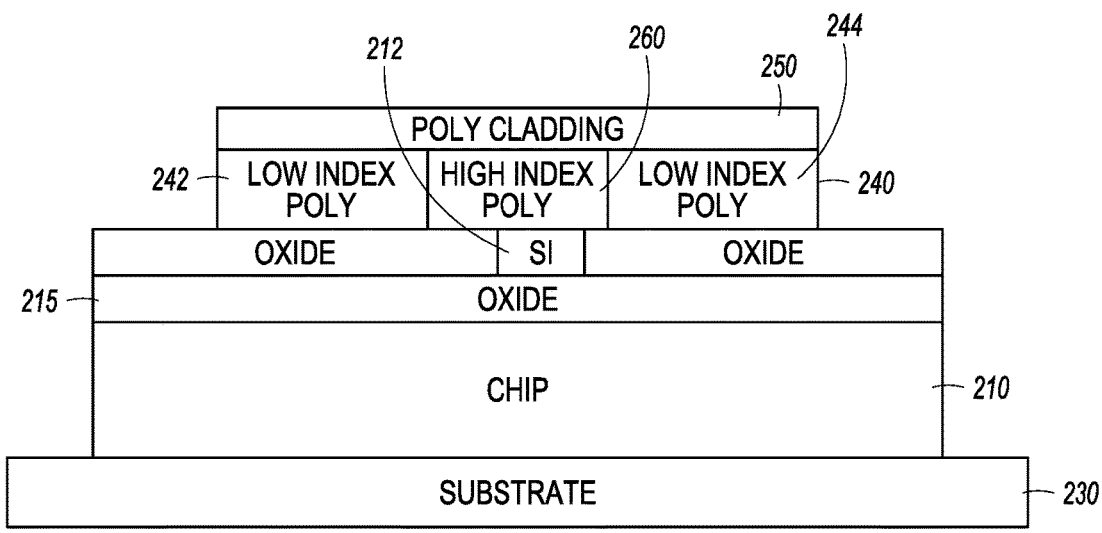

FIG. 3 shows a cross-sectional view of the resulting PIC 200 taken along line A-A in FIG. 2a. As shown, the lithographic process described above defines the high index polymer portion 260 of polymer 240 that is surrounded by low index polymer portions 242 and 244 of polymer 240. In some embodiments the polymer 240, regardless of whether it is applied as a tape or in some other form, may include two layers with different refractive indices, with one layer serving as a core layer and the other layer serving as a cladding layer. In the case of a tape, one of the layers may be an adhesion layer to improve attachment. In this way the multilayer polymer 240 is able to vertically confine optical energy and the subsequent fabrication steps used to form the optical interconnect structure only need to further define the multilayer polymer 240 so that it laterally confines the optical energy along the desired path.

While the optical interconnect structures that are formed will typically be waveguides as illustrated above, more generally the optical interconnect structures may be any structures having regions where the refractive index is made to vary through selective photopolymerization or other processes.

In one particular embodiment, a maskless lithographic process that employs a spatial light modulator (SLM) is used to form the optical interconnect structure. Low-cost SLM lithography systems are available, for instance, with a mercury lamp source offering a spatial resolution of 0.6 μm for single exposure high density waveguide fabrication. One example of such a system is commercially available from Heidelberg Instruments.

Figure 4:
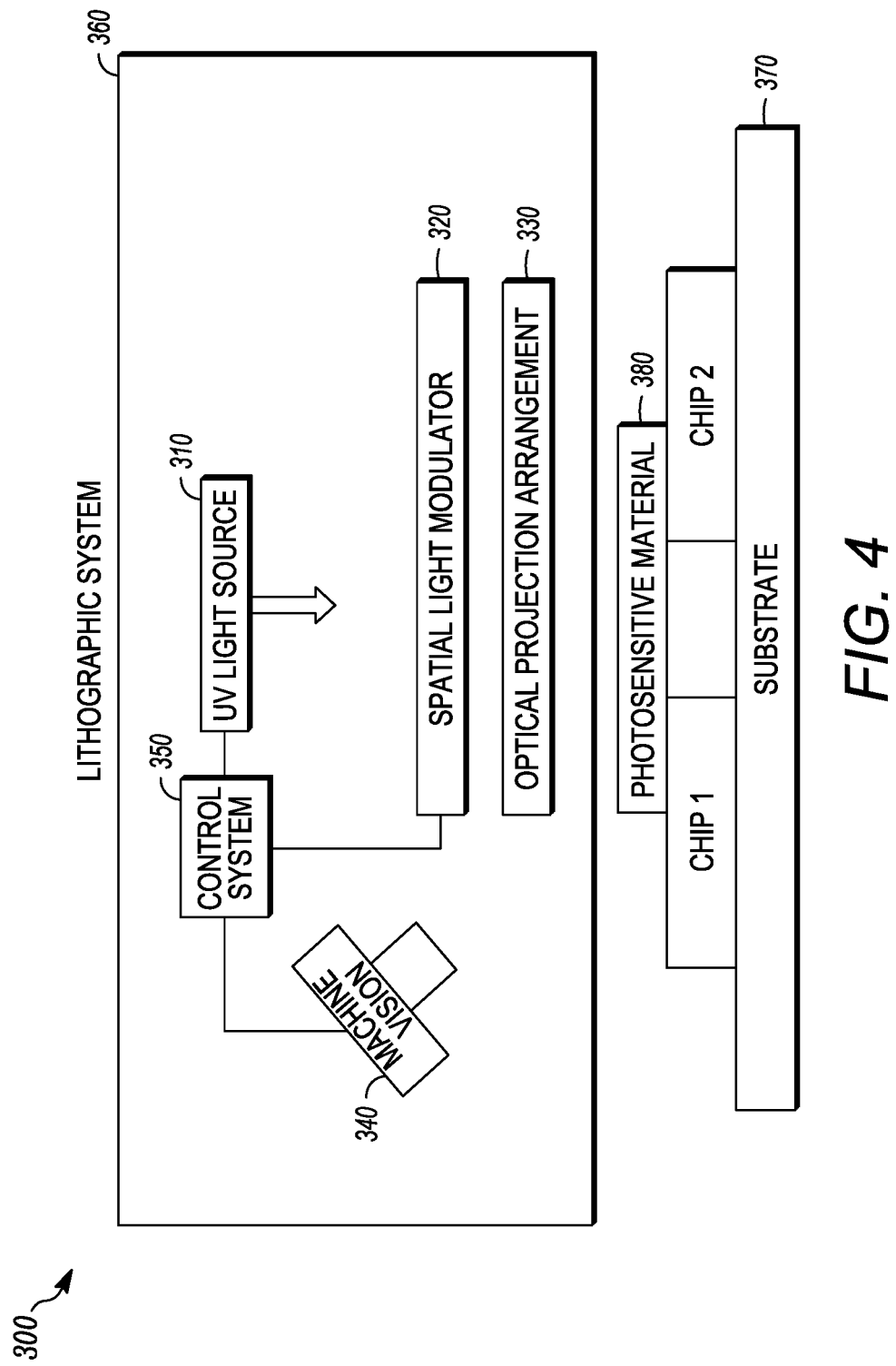
FIG. 4 is a block diagram view of an illustrative maskless lithography system.

FIG. 4 is a block diagram view of an illustrative maskless lithography system 300. The maskless lithography system 300 includes a light source 310 such as the aforementioned mercury lamp source or ultraviolet laser. The light from the light source 310 is directed to a programmable SLM 320. The programmable SLM 320 is configured to receive image pattern data, also referred to as mask layout data, representative of a desirable lithographic pattern, and direct light representative of the image to an optical projection arrangement 330. The light from the optical projection arrangement 330 then falls onto a photosensitive surface 380 of a substrate 370. The optical projection arrangement 330 reduces the dimensions of the image received from the programmable SLM 320 and projects the reduced image onto the photosensitive surface of the substrate.

The lithography system 300 also includes a control system 350 and a vision system 340 to measure the locations on the substrate 370 at which the interconnections are to be made. The vision system 340 may be, by way of illustration, a machine vision camera, a microscope with scanning and stitching capabilities, an x-ray inspection system, or a scanning electron microscope. The control system 350 includes a computer processor, a memory, and a user interface configured to enable a user to input data for instructing the system 300 to produce a printed pattern on or in the photosensitive surface of the substrate 370 on which the optical interconnect structure is to be formed. The entire lithographic system 300 is mounted on a scanning stage or robotic arm 360 whose movement over the substrate is determined by the control system 350 using information obtained from the vision system 350.

The vision system 340 is used to precisely measure the locations of the starting and ending points of the various optical interconnects to be formed. The control system 350 processes the information from the vision system 340 in real time and converts it to the mask layout data that is be projected onto the photosensitive surface of the substrate. In this way the pattern is projected on the substrate based on the locations measured by the vision system 340. The pattern may be projected using a sequence of different exposures. In some cases each exposure may form a two-dimensional layer portion of a three-dimensional optical interconnect structure such as a waveguide.

Accordingly, in contrast to conventional optical lithography processes, it is not necessary to use a high precision positioning stage with interferometric feedback to precisely align the substrate with the lithography system since the vision system 340 is used to specify the pattern that is to be formed and its location on the substrate. For instance, while such a positioning stage may require an accuracy on the order of tens of nanometers, the robotic arm or scanning stage 360 employed in the fabrication process described above only requires an accuracy in position on the order of millimeters or sub-millimeters. The use of the vision system nevertheless allows the optical interconnect structure to be precisely positioned to within an accuracy of tens of nanometers. In this way the vision system obviates the need for a high precision positioning stage to carefully align the substrate and the lithography system.

Figure 5:
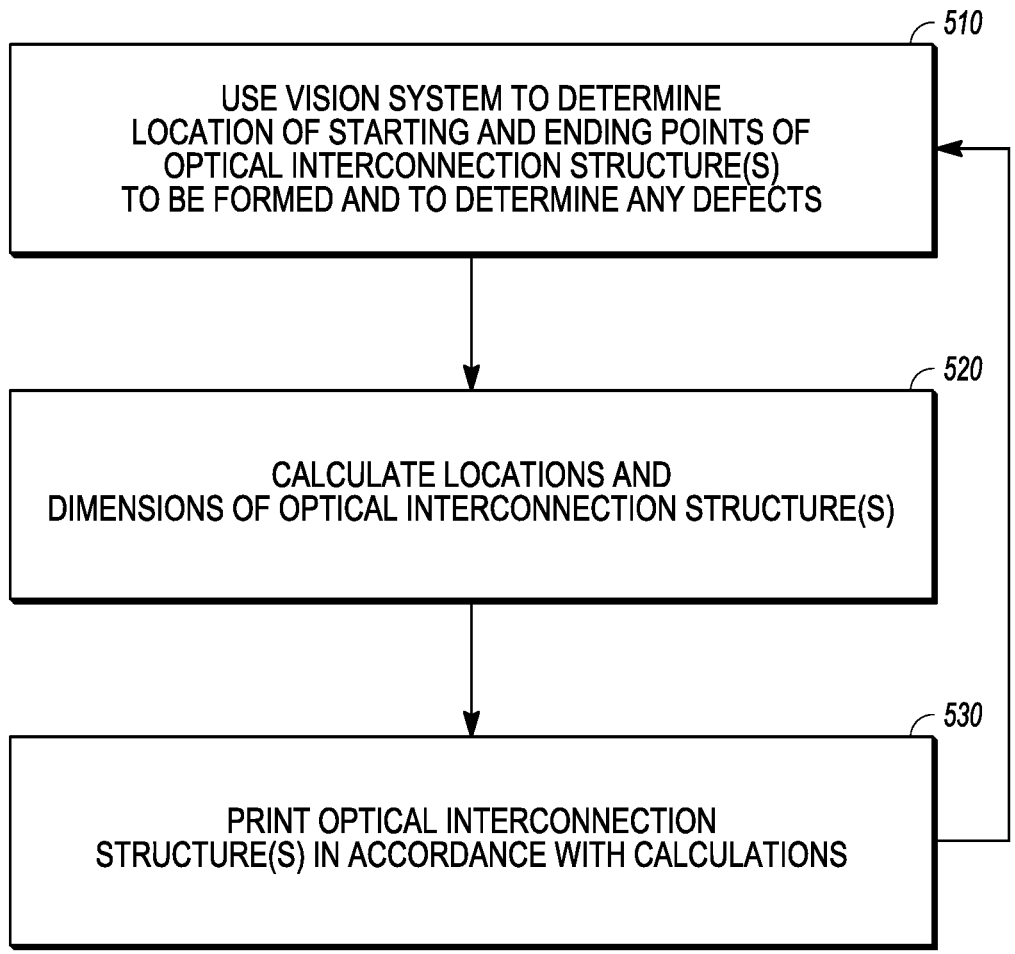
FIG. 5 is a flowchart illustrating one example of a lithographic fabrication process.

The fabrication process described above is further illustrated by the flowchart of FIG. 5. At block 510 the vision system is used to determine the precise position of the chips to be connected and their associated connecting points at which interconnects are to be formed. The information obtained from the vision system is sent to the control system 350, which at block 520 employs algorithms to calculate a favorable geometry for the waveguide interconnect structures which satisfies a number of predetermined parameters. For example, a geometry may be selected for an interconnect structure that permits single-mode operation with the lowest possible propagation losses. This geometry is converted to a digital dataset (the mask layout data) and is used by the control system to control operation of the light source, the programmable SLM and the scanning stage or robotic arm. In this way, at block 530 the optical waveguide interconnect structures can be printed in the volume of the photosensitive polymer located on the surface of the substrate in accordance with the dataset.

The dimensions of the optical interconnect structures can be taken from a predetermined library of dimensions or they can be optimized in real time by minimizing the optical loss of a set of designs using, for instance, finite-difference time-domain (FDTD) analysis. When more than one optical interconnect structure is to be fabricated, the locations of all of the connections are determined to avoid overlap. Once the dimensions and trajectories of the optical interconnect structures are determined, the exposure dosage also can be determined by the control system based on such factors as temperature, polymer shrinkage and humidity.

The vision system also may be used during the fabrication process to monitor the printing of the pattern and the data so obtained may be used by the control system in a closed-loop process to adjust the programming of the SLM as necessary while printing is in progress. For instance, the vision system can be used to monitor the fidelity, contrast and size of the pattern used to form the optical interconnect structures, as well as the exposure pattern and dosage. The exposure pattern and dose can be changed in real time to achieve predefine targets. Likewise, after fabrication of all or parts of the optical interconnect structures, the results can be examined by the vision system to look for defects. One or more of the optical interconnect structures can be removed by wet and/or dry etching if any defects are found and then re-printed. If multiple exposures are employed, after a portion of an optical interconnection is formed by one exposure the vision system may be used to detect any defects in that exposure step before proceeding to the next exposure step.

The process described above can be generalized to a "smart", or adaptive, lithography operation. Whereas lithography is understood to be the printing of a prescribed pattern, the system described above is not limited to printing a pre-determined or prescribed pattern. Instead, it uses an automatic adaptive algorithm to generate a distinctive pattern in response to what the vision system sees in its field of view. Whereas some conventional lithography systems may have some capabilities for automatic alignment to known reference marks in the field, they are nevertheless still printing a pre-determined or prescribed pattern translated to align to suitable reference marks.

In one aspect, the system described here is distinctive in that the pattern that is printed may have altogether different features depending on what the vision system sees in its field. While this may also be used for alignment, the pattern that is generated by the algorithm may differ substantially in geometry and features beyond lateral shifts associated with alignment. The waveguide pattern required to complete the optical connections in an array as described earlier is just one example of such a "smart" or adaptive lithography operation. Other examples could include, by way of example, changes in the exposure parameters, the dimensions or scale of features to be printed, or even radically different patterns depending in some causal manner on what the vision system sees. In this respect, the "smart" lithography system may find compelling printing applications ranging from industrial manufacturing to structures, potentially including tissues, for biomedical and life sciences applications.

While the lithographic system described above employs an optical lithography technique, other lithographic techniques may be instead, such as imprint lithography or electron beam lithography, for example. Moreover, in another alternative embodiment, instead of fabricating the optical interconnect structures using a lithographic process, the optical interconnect structures may be formed using a high resolution three-dimensional (3D) printer. Such printers are commercially available which have a resolution of 1 micron, a mechanical precision of 100 nm, an accuracy of 500 nm and a build volume of 6×6×6 inches.

Figure 6:
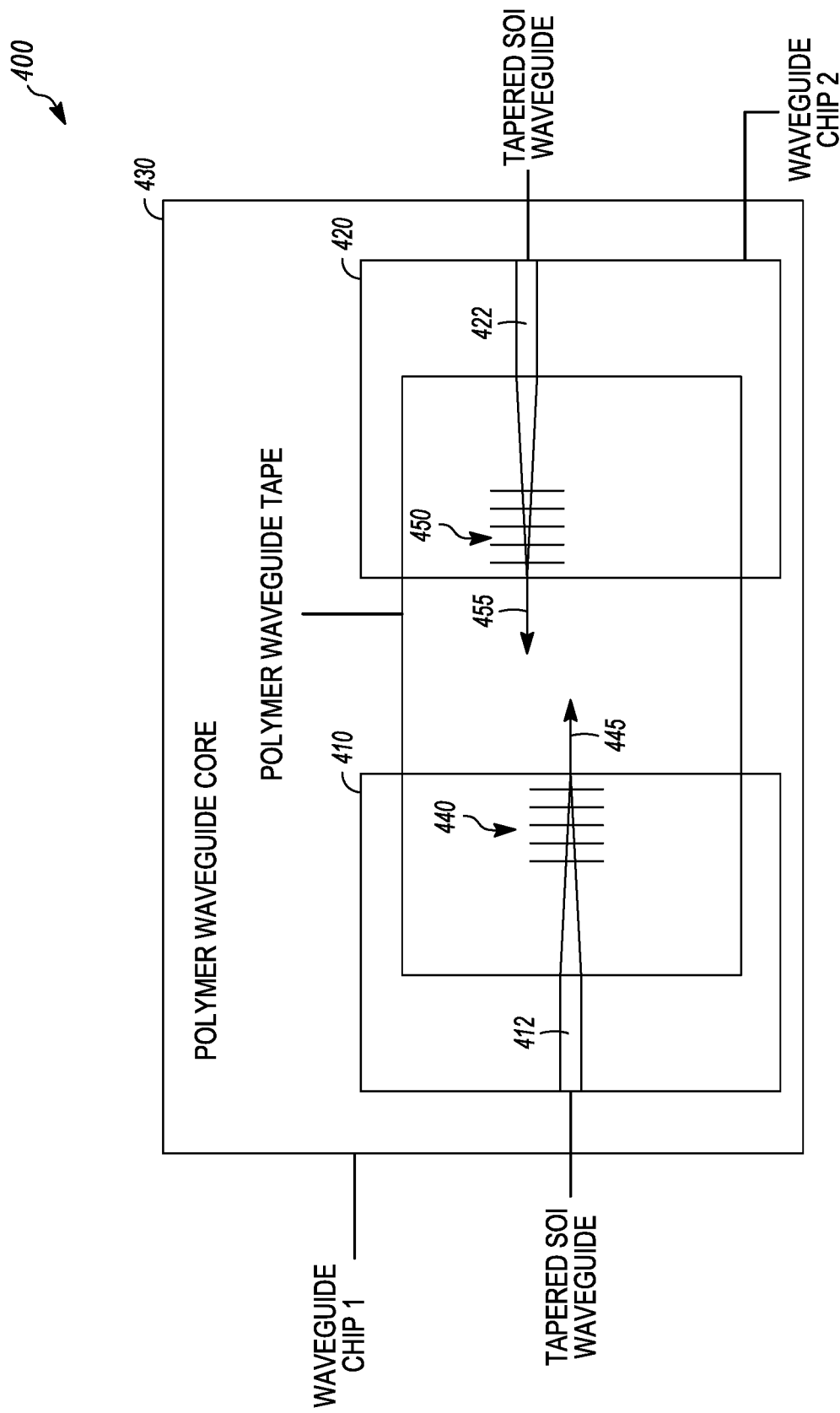
FIG. 6 shows a simplified plan view of a PIC similar to that shown in FIG. 2a in which an out-of-band writing technique is used to fabricate an optical interconnect structure such as a waveguide.

Yet another fabrication technique that may be used to form the optical interconnect structures employs write-beams that are injected into photosensitive material using diffractive couplers that are integrated on the chips that are being interconnected. This is illustrated in FIG. 6, which shows a simplified plan view of a PIC 400 similar to that shown in FIG. 2a. As shown, two chips 410 and 420 are located on a substrate 430 and include respective waveguides 412 and 422 that are to be interconnected with one another. As in FIG. 2a, the waveguides 412 and 422 include inverse tapers. Diffractive couplers 440 and 450 such as optical gratings are respectively integrated with the respective waveguides 412 and 422. The diffractive couplers 440 and 450 are designed to couple optical wavelengths that are out-of-band with respect to the optical wavelengths that propagate in the waveguides 412 and 422. Light at these out-of-band wavelengths that is launched into the diffractive couplers 440 and 450 from a direction out of the plane in which the PIC and waveguides 212 and 222 extend serve as write beams that are redirected into the plane as indicated by the arrows 445 and 455 in FIG. 6. In this way the write beams 445 and 455 are directed into the photosensitive volume of material. The out-of-band wavelengths are chosen to induce polymerization or other reactions that create the refractive index changes in the photosensitive material. Interference that arises between the two write beams causes the optical interconnect structure to be written in the photosensitive volume of material. In this way the optical interconnect structure is effectively "self-writing" and "self-aligning."

While exemplary embodiments and particular applications of this invention have been shown and described, it is apparent that many other modifications and applications of this invention are possible without departing from the inventive concepts herein disclosed. For example, in some embodiments, instead of a lithographic technique, a direct laser writing technique may be employed in which a scanning laser is used to write the optical interconnect structure in the photosensitive material. In addition, in some embodiments the lithographic technique described above in which a vision system is employed may be used to fabricate other types of structures and devices in a photosensitive or other material. Examples of such structures or devices include, without limitation, integrated circuits, microelectromechanical systems (MEMS), optical filters, microfluidic sensors, microchemical reactors, memory devices, photodetectors, solar cells, displays and touch sensors.

The invention claimed is:

1. A method of fabricating an optical connection to at least one planar optical waveguide integrated on a planar integrated circuit (PIC), comprising:

detecting one or more positions at which one or more optical connections to the at least one planar optical waveguide are to be formed;

configuring a spatial light modulator (SLM) for use as a programmable photolithographic mask through which the one or more optical connections are able to be directly written in a volume of photosensitive material using a photolithographic process without contacting the photosensitive material, the configuring including programming the SLM to expose the volume of photosensitive material to an illumination pattern that defines the one or more optical connections, the programming being based at least in part on the detected positions; and printing the one or more optical connections in the volume of photosensitive material by exposing the volume of photosensitive material to illumination that is modulated by the pattern with which the SLM is programmed.

2. The method of claim 1, further comprising simultaneously printing a plurality of optical connections by programming the SLM to expose the volume of photosensitive material to an illumination pattern that defines the plurality of optical connections.

3. The method of claim 1, further comprising:
monitoring the printing using a vision measuring system to obtain location information;
based on the location information, adjusting the programming of the SLM while printing is in progress.

4. The method of claim 3, wherein adjusting the programming of the SLM includes adjusting the programming of the SLM to reduce optical loss in the one or more optical connections being printed.

5. The method of claim 3, wherein printing the one or more optical connections comprises a plurality of different exposures that each print a portion of the one or more optical connections and further wherein monitoring the printing includes using the vision measuring system to detect defects arising in one exposure step before proceeding to another exposure step.

6. The method of claim 1, wherein the at least one optical connection includes an optical waveguide.

7. The method of claim 1, wherein programming the SLM based at least in part on the detected positions includes calculating at least starting and ending locations and a dimension of the one or more optical connections that are to be printed.

8. The method of claim 1, wherein the photosensitive material includes a photopolymer.

9. The method of claim 1, wherein printing the one or more optical connections comprises a plurality of different exposures that each print a portion of the one or more optical connections.

10. The method of claim 9, wherein one or more optical connections includes a three-dimensional (3D) optical structure and the different exposures each form a two-dimensional (2D) layer portion of the 3D optical structure.

11. The method of claim 1, wherein detecting the one or more positions further comprises detecting any obstructions on the PIC that are to be avoided when printing the one or more optical connections.

12. The method of claim 1, further comprising:
monitoring the printing using a vision measuring system; and
adjusting the programming of the SLM based on the monitoring.

13. A method of fabricating one or more structures on a substrate, comprising:

detecting one or more positions at which one or more structures are to be formed on the substrate;

configuring a spatial light modulator (SLM) for use as a programmable photolithographic mask through which the one or more structures are able to be directly written in a volume of photosensitive material using a photolithographic process without contacting the photosensitive material, the configuring including programming the SLM to expose the volume of photosensitive material to an illumination pattern that defines the one or more structures, the programming being based at least in part on the detected positions; and printing the one or more structures in the volume of photosensitive material by exposing the volume of photosensitive material to illumination that is modulated by the pattern with which the SLM is programmed.

* * * * *